US008462549B2

(12) United States Patent
Haratsch et al.

(10) Patent No.: US 8,462,549 B2
(45) Date of Patent: Jun. 11, 2013

(54) METHODS AND APPARATUS FOR READ-SIDE INTERCELL INTERFERENCE MITIGATION IN FLASH MEMORIES

(75) Inventors: Erich F. Haratsch, Bethlehem, PA (US); Milos Ivkovic, Allentown, PA (US); Victor Krachkovsky, Allentown, PA (US); Nenad Miladinovic, Campbell, CA (US); Andrei Vityaev, San Jose, CA (US); Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 152 days.

(21) Appl. No.: 13/001,278

(22) PCT Filed: Jun. 30, 2009

(86) PCT No.: PCT/US2009/049326
§ 371 (c)(1),
(2), (4) Date: Feb. 25, 2011

(87) PCT Pub. No.: WO2010/002941
PCT Pub. Date: Jan. 7, 2010

(65) Prior Publication Data
US 2011/0141815 A1    Jun. 16, 2011

Related U.S. Application Data

(60) Provisional application No. 61/133,675, filed on Jul. 1, 2008, provisional application No. 61/133,921, filed on Jul. 7, 2008, provisional application No. 61/134,688, filed on Jul. 10, 2008, provisional application No. 61/135,732, filed on Jul. 22, 2008, provisional application No. 61/194,751, filed on Sep. 30, 2008.

(51) Int. Cl.
*G11C 11/34* (2006.01)
(52) U.S. Cl.
USPC ............ 365/185.03; 365/185.12; 365/185.17; 365/185.18; 365/185.24; 365/185.33
(58) Field of Classification Search
USPC ............. 365/185.03, 185.12, 185.17, 185.18, 365/185.24, 185, 33
See application file for complete search history.

(56) References Cited

U.S. PATENT DOCUMENTS

| | | | |
|---|---|---|---|
| 5,867,429 A | 2/1999 | Chen et al. | |
| 7,573,739 B2 * | 8/2009 | Yun et al. | 365/185.03 |
| 2006/0221714 A1 | 10/2006 | Li et al. | |

FOREIGN PATENT DOCUMENTS
WO    WO 2007/149678    12/2007

* cited by examiner

*Primary Examiner* — Trong Phan
(74) *Attorney, Agent, or Firm* — Ryan, Mason & Lewis, LLP

(57) ABSTRACT

Methods and apparatus are provided for read-side intercell interference mitigation in flash memories. A flash memory device is read by obtaining a read value for at least one target cell; obtaining a value representing a voltage stored in at least one aggressor cell that was programmed after the target cell; determining intercell interference for the target cell from the at least one aggressor cell; and obtaining a new read value that compensates for the intercell interference by removing the determined intercell interference from the read value for the at least one target cell. The new read value can optionally be provided to a decoder. In an iterative implementation, one or more intercell interference mitigation parameters can be adjusted if a decoding error occurs.

27 Claims, 9 Drawing Sheets

METHODS AND APPARATUS FOR READ-SIDE INTERCELL INTERFERENCE MITIGATION IN FLASH MEMORIES

CROSS-REFERENCE TO RELATED APPLICATIONS

The present application claims priority to U.S. Provisional Patent Application Serial No. 61/133,675, filed Jul. 1, 2008; U.S. Provisional Patent Application Serial No. 61/133,921, filed Jul. 7, 2008; U.S. Provisional Patent Application Serial No. 61/134,688, filed Jul. 10, 2008; U.S. Provisional Patent Application Serial No. 61/135,732, tiled Jul. 22, 2008; and U.S. Provisional Patent Application Serial No. 61/194,751, filed Sep. 30, 2008, each incorporated by reference herein.

The present application is related to International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," and International Patent Application entitled "Methods and Apparatus for Write-Side Intercell Interference Mitigation in Flash Memories;" International Patent Application entitled "Methods and Apparatus for Interfacing Between a Flash Memory Controller and a Flash Memory Array;" International Patent Application entitled "Methods and Apparatus for Intercell Interference Mitigation Using Modulation Coding;" and International Patent Application entitled "Methods and Apparatus for Soft Demapping and Intercell Interference Mitigation in Flash Memories," each filed contemporaneously herewith and incorporated by reference herein.

FIELD OF THE INVENTION

The present invention relates generally to flash memory devices and more particularly, to improved techniques for mitigating the effect of intercell interference in such flash memory devices.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example. each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). For a more detailed discussion of MLC flash memory devices, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding And Per-Page Coding," incorporated by reference herein.

In multi-level NAND flash memory devices, for example, floating gate devices are employed with programmable threshold voltages in a range that is divided into multiple intervals with each interval corresponding to a different multibit value. To program a given multibit value into a memory cell, the threshold voltage of the floating gate device in the memory cell is programmed into the threshold voltage interval that corresponds to the value.

The analog values stored in memory cells are often distorted. The distortions are typically due to, for example, back pattern dependency (BPD), noise and intercell interference (ICI). For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories." IEEE J. of Solid State Circuits, Vol. 43, No. 4, 919-928, (April 2008), each incorporated by reference herein.

ICI is a consequence of parasitic capacitances between cells and is generally considered to be the most prominent source of distortion. Id. For example, ICI is known to increase with technology scaling and becomes a significant source of distortion of the threshold voltage distribution as transistor sizes become smaller. Thus, ICI is of particular concern for reliable MLC memories, as ICI limits the number of voltage levels that can reliably be stored in the MLC memory.

A number of techniques have been proposed or suggested for mitigating the effect of ICI by reducing the capacitive coupling between cells. For example, Ki-Tae Park, et al. describe existing programming techniques, such as even/odd programming, bottom up programming and multi-stage programming that mitigate ICI. While these existing methods have helped to reduce the effect of ICI, they become less effective as transistor sizes are reduced, for example, below 65 nm technologies, where parasitic capacitances are much larger due to the close proximity of flash cells. A need therefore exists for improved signal processing and coding techniques for mitigating the effect of ICI.

SUMMARY OF THE INVENTION

Generally, methods and apparatus are provided for read-side intercell interference mitigation in flash memories. According to one aspect of the invention, a flash memory device is read by obtaining a read value for at least one target cell; obtaining a value representing a voltage stored in at least one aggressor cell that was programmed atler the target cell; determining intercell interference for the target cell from the at least one aggressor cell; and obtaining a new read value that compensates for the intercell interference by removing the determined intercell interference from the read value for the at least one target cell. The new read value can optionally be provided to a decoder. The aggressor cells comprise one or more cells adjacent to the target cell, such as adjacent cells in a same wordline as the target cell and/or cells in an upper or lower adjacent wordline to the target cell.

In one variation of the invention, the value representing a voltage stored in at least one aggressor cell comprises one or more of a measured value, an expected value, an estimated value, an average value, a quantized value and a detected value. The measured value may comprise, for example, hard voltage values, soft voltage values or a combination thereof. The expected value may comprise, for example, a mean of a voltage distribution associated with a given state.

In an exemplary iterative implementation, one or more intercell interference mitigation parameters can be adjusted if a decoding error occurs. For example, the intercell interference mitigation parameters may comprise, for example, (i) a number of considered aggressor cells; or (ii) a use of soft voltage values in addition to hard voltage values. The disclosed techniques can optionally be applied to one or more steps of a multi-step page programming sequence.

A more complete understanding of the present invention, as well as further features and advantages of the present invention, will be obtained by reference to the following detailed description and drawings.

DETAILED DESCRIPTION

Various aspects of the present invention are directed to signal processing techniques for mitigating ICI in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages or currents to represent stored data, as would be apparent to a person of ordinary skill in the art.

Figure 1:
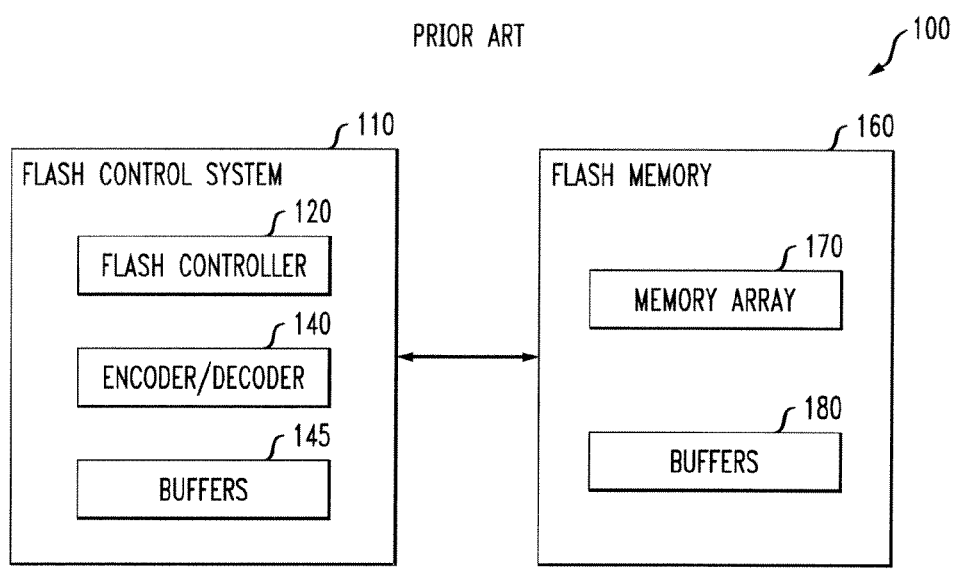
FIG. 1 is a schematic block diagram of a conventional flash memory system.

FIG. 1 is a schematic block diagram of a conventional flash memory system 100. As shown in FIG. 1. the exemplary flash memory system 100 comprises a flash control system 110 and a flash memory block 160. The exemplary flash control system 110 comprises a flash controller 120, an encoder/decoder block 140 and one or more buffers 145. In an alternative embodiment. the encoder decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), an MRAM memory. a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
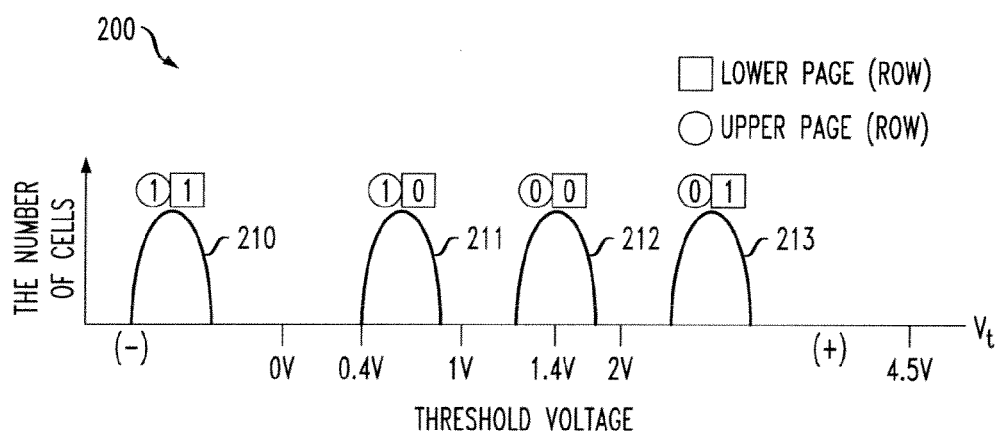
FIG. 2 illustrates an exemplary threshold voltage distribution for the exemplary multi-level cell flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 170 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 2, each storage element employs four possible data states to store two bits of data in each memory cell. As shown in FIG. 2, the two stored bits comprise a bit for a Lower Page and a bit for an Upper Page of a given row or wordline. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit, MSB). State 210 is generally the initial unprogrammed or erased state of the cell. Likewise, when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213. it represents a "1" for the lower bit and a "0" for the upper bit.

Threshold voltage distribution 210 represents a distribution of the threshold voltages $V_t$ of the cells within the array that are in an erased state ("II" data state), with negative threshold voltage levels below 0 volts. Threshold voltage distributions 211 and 212 of memory cells storing "10" and "00" user data, respectively, are shown to be between 0 and 1 volts and between 1 and 2 volts, respectively. Threshold voltage distribution 213 shows the distribution of cells that have been programmed to the "01" data state with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
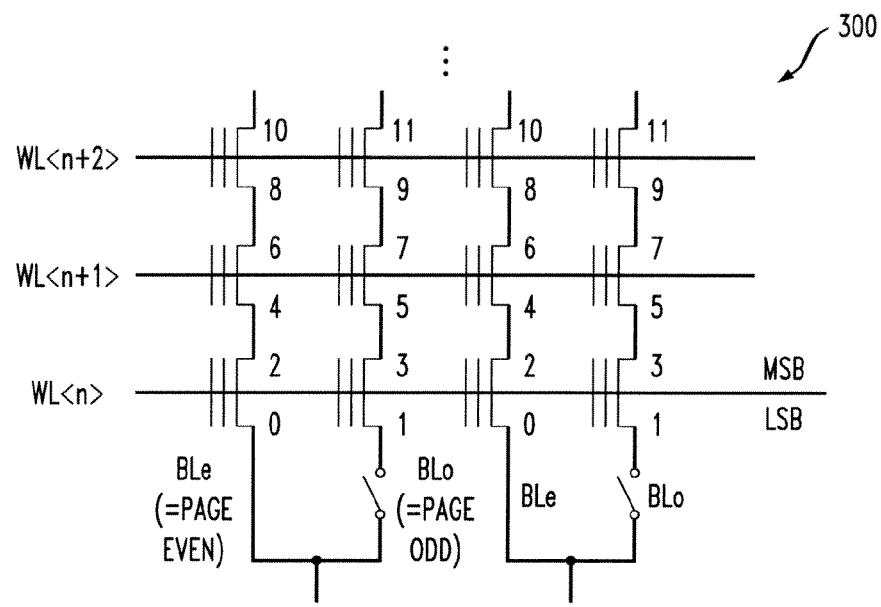
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores for example even pages 0 and 2 in the even bitlines, and odd pages 1 and 3 in the odd bit lines.

In addition, FIG. 3 indicates an exemplary program sequence where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, 919-928 (April 2008), incorporated by reference herein.

Figure 4:
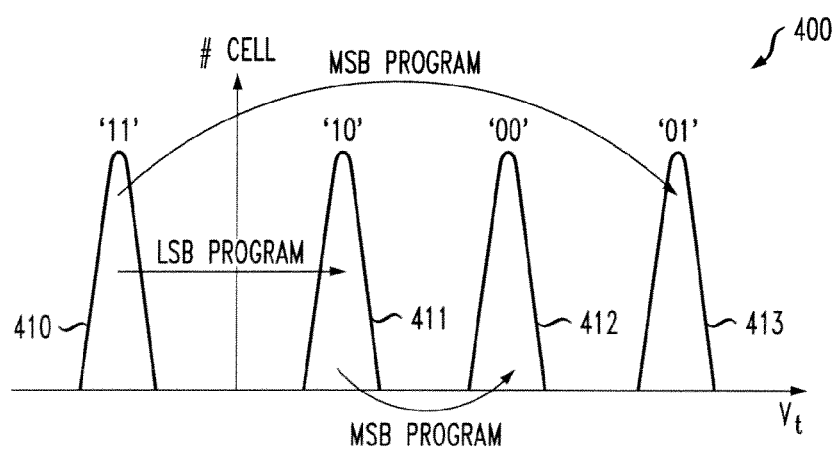
FIG. 4 illustrates an exemplary two-stage MLC programming scheme for the voltage assignment scheme of FIG. 2.

FIG. 4 illustrates an exemplary two-stage MLC programming scheme 400 for the voltage assignment scheme of FIG. 2. As shown in FIG. 4, during an LSB program stage, the states of selected cells that are in an erased state 410 move to the lowest programmed state 411 if the LSB is zero. Thus, at the LSB programming stage, a memory cell is programmed from the erased state '11' to '10'. Next, during the MSB program stage, two states, state '00' (412) and state '01' (413) are formed sequentially, depending on the previous LSB data. Generally, during the MSB programming stage, the '10' state is programmed to '00', and the state '11' is programmed to '01'.

It is noted that the programming scheme 400 of FIG. 4 illustrates a maximum voltage shift associated with the change in state from state 410 to state 413. A number of programming schemes have been proposed or suggested to reduce the maximum voltage shift associated with a change in state, and thereby reduce the ICI caused by voltage shifts.

Figure 5A:
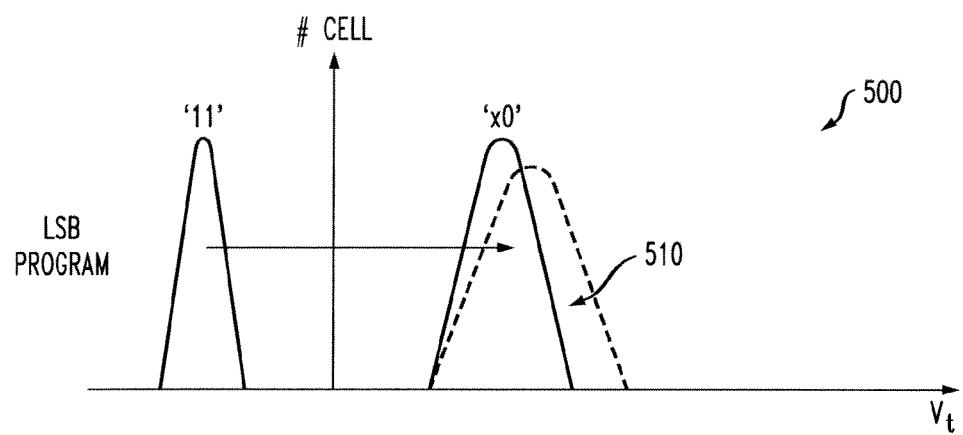
FIGS. 5A and 5B, collectively, illustrate an alternative MLC programming scheme that reduces the ICI inflicted on neighboring cells.
Figure 5B:
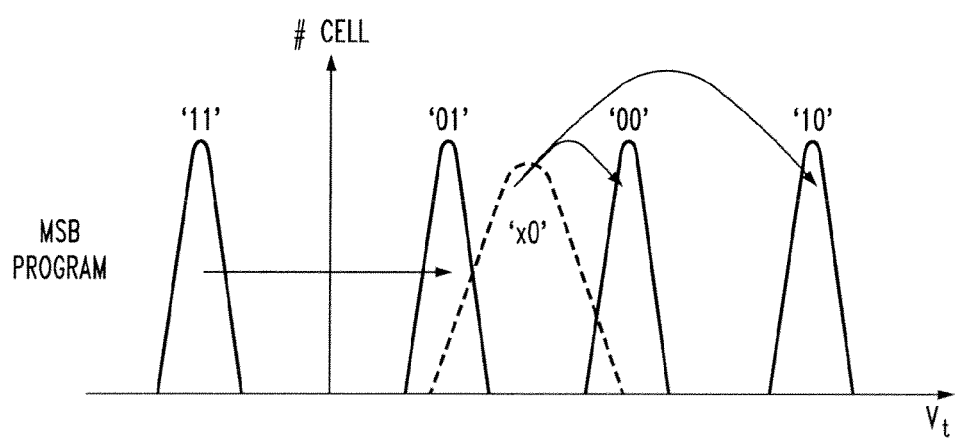

FIGS. 5A and 5B. collectively, illustrate an alternative MLC programming scheme 500 that reduces the ICI inflicted on neighboring cells. As shown in FIG. 5A, during the LSB programming stage. a memory cell is programmed from a state '11' to a state 'x0' as a temporary (or intermediate) state, in a similar manner to SLC programming. to After the neighbor cells in the same wordline are also LSB programmed, the distribution is possibly widened as shown by peak 510 in FIG. 5A, due to ICI. Thereafter, at the MSB programming stage, shown in FIG. 5B, the 'x0' state is programmed to either '00' and '10' as the final state corresponding to the input data or else the '11' state is programmed to the final '01' state. Generally, all memory cells except '11' cells are reprogrammed to their final states at the MSB programming stage from the temporary programmed state for LSB data so that the ICI caused by neighbor cells can be largely reduced. A cell in the final state will not suffer from ICI it experienced while being in the intermediate state since it has been reprogrammed to the final state. A cell in the final state will only suffer from ICI it experienced since being in the final state. As noted above, the multi-step programming sequence of FIGS. 5A and 5B, using intermediate program states, reduces the maximum voltage changes and therefore the ICI caused by these voltage changes. It can been seen in FIG. 5B that the maximum voltage shifts for example during the MSB programming stage are associated with transitions from state '11' to '01' and state 'x0' to state '10' respectively. These voltage shifts are significantly smaller than the maximum voltage shift from state '11' to '01' in FIG. 4.

Figure 6:
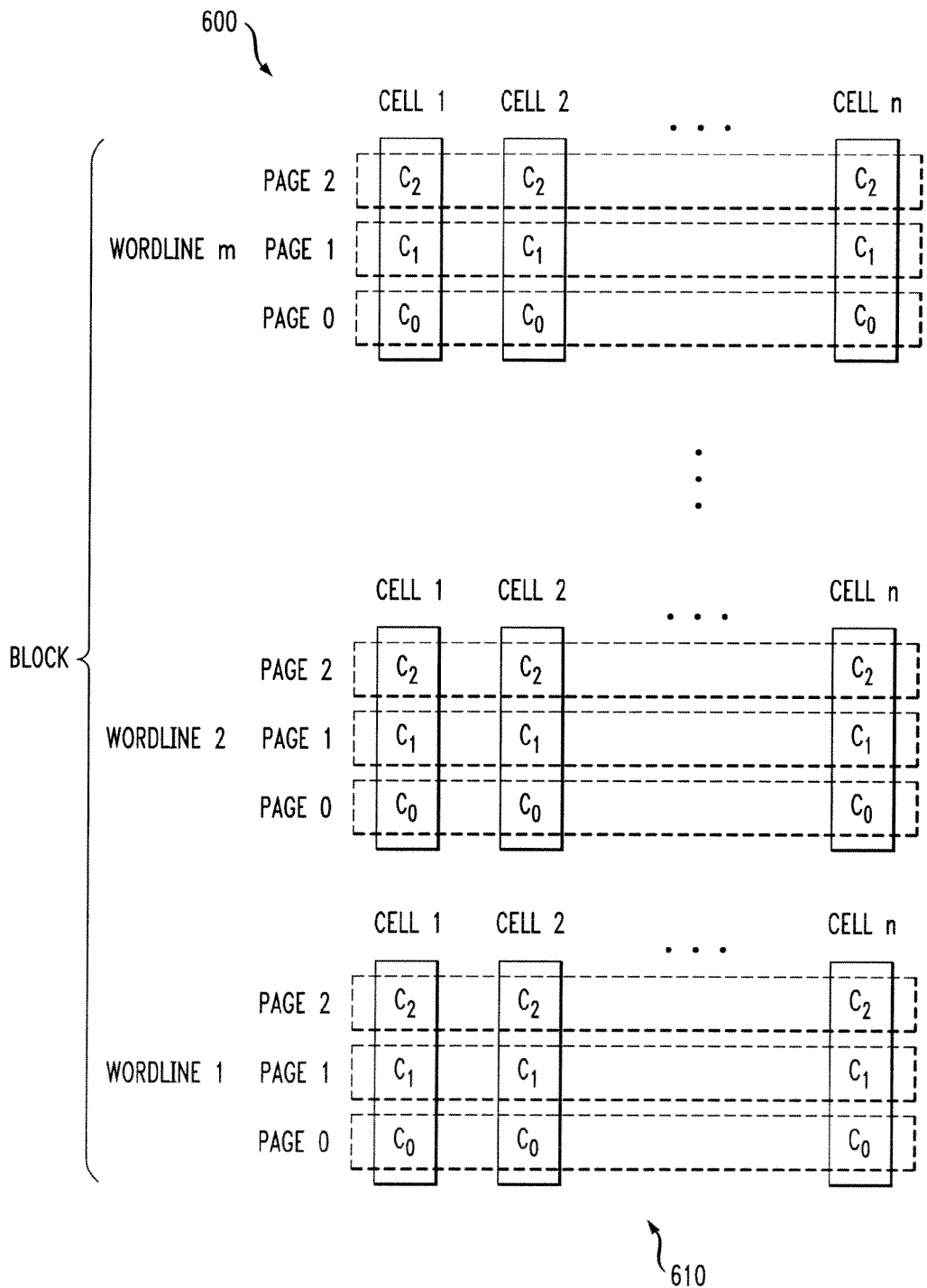
FIG. 6 illustrates an exemplary flash cell array in a multi-level cell (MLC) flash memory device in further detail.

FIG. 6 illustrates an exemplary flash cell array 600 in a multi-level cell (MLC) flash memory device 130 in further detail. As shown in FIG. 6, the flash cell array 600 stores three bits per flash cell. $c_i$. FIG. 6 illustrates the flash cell array architecture for one block. where each exemplary cell typically corresponds to a floating-gate transistor that stores three bits. The exemplary cell array 600 consists of m wordlines and n bitlines. Typically, in current multi-page cell flash memories the bits within a single cell belong to different pages. In the example of FIG. 6, the three bits for each cell correspond to three different pages, and each wordline stores three pages. In the following discussion, pages 0, 1, and 2 are referred to as the lower middle, and upper page levels within a wordline.

As indicated above, a flash cell array can be further partitioned into even and odd pages, where for example cells with even numbers (such as cells 2 and 4 in FIG. 6) correspond to even pages, and cells with odd numbers (such as cells 1 and 3 in FIG. 6) correspond to odd pages. In this case, a page (such as page 0) would contain an even page (even page 0) in even cells and an odd page (odd page 0) in odd cells.

Intercell Interference

Figure 7:
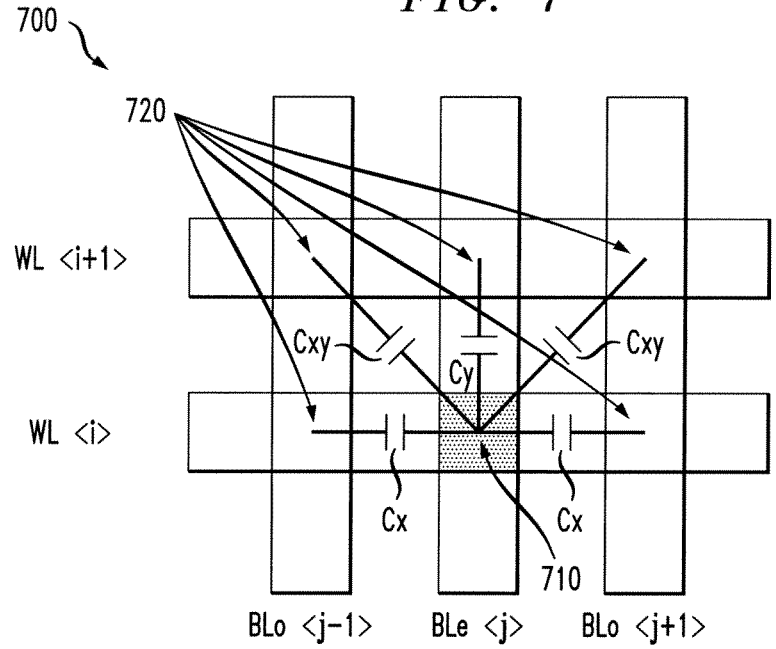
FIG. 7 illustrates the ICI that is present for a target cell due to the parasitic capacitance from a number of exemplary aggressor cells.

As previously indicated, ICI is a consequence of parasitic capacitances between cells and is generally considered to be one of the most prominent sources of distortion. FIG. 7 illustrates the ICI that is present for a target cell 710 due to the parasitic capacitance from a number of exemplary aggressor cells 720. The following notations are employed in FIG. 7:

WL<i>: wordline i;
BL<j>: bitline j;
BLo<j>: odd bitline j;
BLe<j>: even bitline j; and
$C_x$, $C_y$ and $C_{xy}$: capacitance in the x, y and xy directions, respectively.

The present invention recognizes that ICI is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

The ICI caused by the aggressor cells 720 on the target cell 710 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of aggressor cell (w,b), where w indicates a wordline i and b indicates a bitline j, $\Delta V_{ICI}^{(i,j)}$ is the change in $V_t$ voltage of target cell (i,j), due to ICI and $k_x$, $k_y$, and $k_{xy}$ are capacitive coupling coefficients for the x, y and xy directions shown in FIG. 7.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

System Level Considerations

Figure 8:
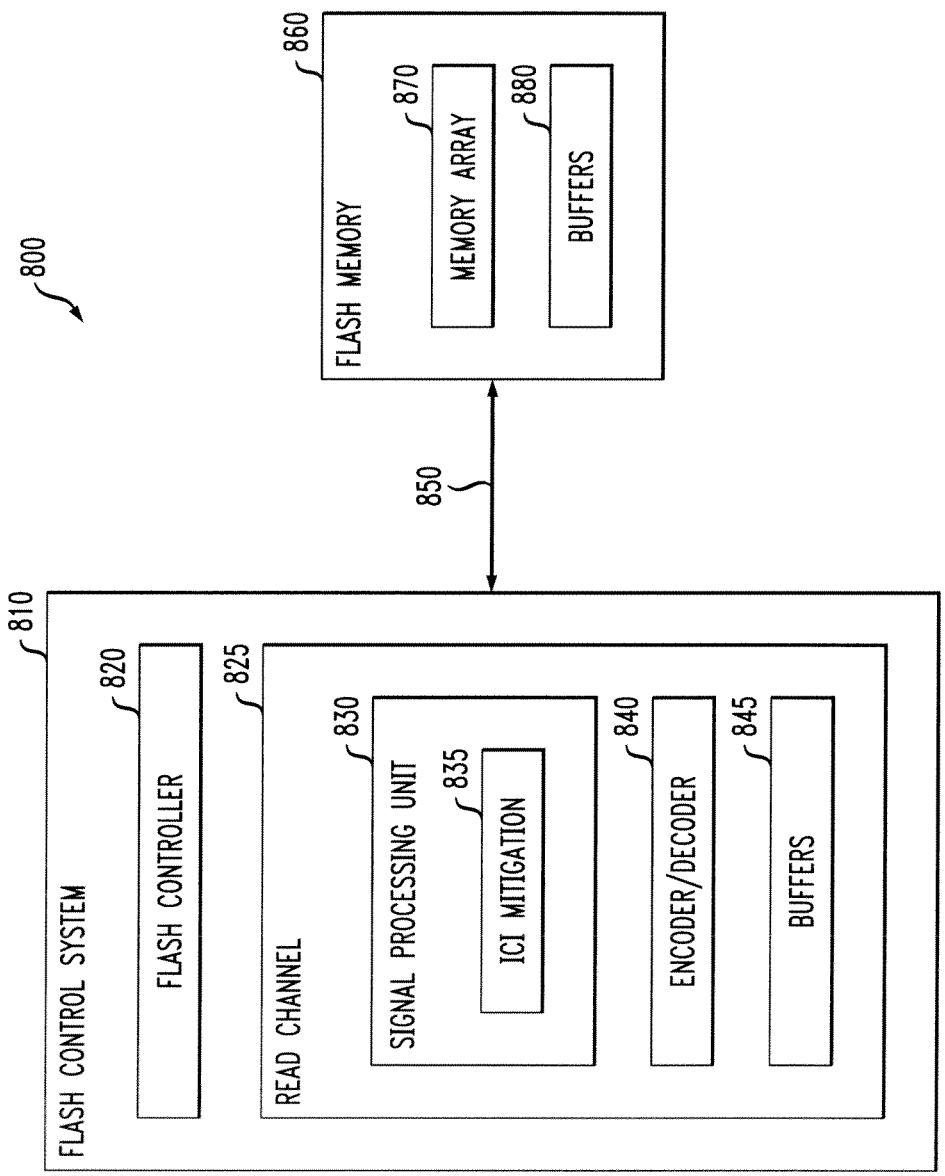
FIG. 8 is a schematic block diagram of an exemplary flash memory system incorporating controller-based ICI mitigation techniques in accordance with the present invention.

FIG. 8 is a schematic block diagram of an exemplary flash memory system 800 incorporating controller-based ICI mitigation techniques in accordance with the present invention. As shown in FIG. 8, the exemplary flash memory system 800 comprises a flash control system 810 and a flash memory block 860, connected by an interface 850. The exemplary flash control system 810 comprises a flash controller 820 and a read channel 825. typically on one or more integrated circuits. The exemplary flash controller 820 may be implemented, for example, using well-known commercially available techniques and/or products, as modified herein to support the features and functions of the present invention.

The exemplary read channel 825 comprises a signal processing unit 830, an encoder/decoder block 840 and one or more buffers 845. It is noted that the term "read channel" can encompass the write channel as well. In an alternative embodiment, the encoder/decoder block 840 and some butlers 845 may be implemented inside the flash controller 820. The encoder/decoder block 840 and buffers 845 may be implemented, for example, using well-known commercially available techniques and/or products, as modified herein to provide the features and functions of the present invention.

The exemplary signal processing unit 830 comprises one or more processors that implement one or more ICI mitigation processes 835, discussed further below in conjunction with, for example, FIGS. 10-12. In addition, the data flow among the various blocks shown in FIG. 8 is also discussed further below in conjunction with, for example, FIGS. 10-12. Generally, as discussed further below in conjunction with FIGS. 11 and 12, to perform ICI mitigation during a read operation, the one or more ICI mitigation processes 835 compute new read values based on the hard or soft read values. Likewise, as discussed further below in conjunction with FIG. 10, to perform ICI mitigation during a write operation, the one or more ICI mitigation processes 835 generate precompensated program values to be stored in the memory array 870 based on program data for the target and aggressor cells.

The exemplary flash memory block 860 comprises a memory array 870 and one or more buffers 880 that may each be implemented using well-known commercially available techniques and/or products.

In various embodiments of the disclosed ICI mitigation techniques, the exemplary interface 850 may need to convey additional information relative to a conventional flash memory system, such as values representing information associated with aggressor cells. Thus, the interface 850 may need to have a higher capacity (for example more input or output pins) or faster rate than an interface in conventional flash memory systems. The interface 850 may optionally be implemented, for example, in accordance with the teachings of International PCI Patent Application Serial. No. PCT/US09/49328, entitled "Methods and Apparatus for Interfacing Between a Flash Memory Controller and a Flash Memory Array," filed contemporaneously herewith and incorporated by reference herein, which increases the information-carrying capacity of the interface 850 using, for example, Double Data Rate (DDR) techniques.

During a write operation, the interface 850 transfers the precompensated program values to be stored in the target cells. typically using page or wordline level access techniques. For a more detailed discussion of exemplary page or wordline level access techniques, see, for example. International Patent Application Serial No. PCT/US09/36810, tiled Mar. 11, 2009, entitled "Methods and Apparatus for Storing Data in a Multi-Level Cell Flash Memory Device with Cross-Page Sectors, Multi-Page Coding And Per-Page Coding,", incorporated by reference herein. Typically, more bits are required to represent precompensated program values than to represent original program values since the number of precompensated program values is typically larger than the number of original program values. Therefore, for write-side ICI mitigation, the interface 850 needs to transfer more data than a conventional interface.

During a read operation, the interface 850 transfers hard and/or soft read values that have been obtained from the memory array 870 for target and aggressor cells. For example, in addition to read values for the page with the target cell, read values for one ore more adjacent pages in upper/lower wordlines or neighboring even or odd bit lines are transferred over the interface bus.

In the embodiment of FIG. 8, the disclosed write- or read-side ICI mitigation techniques are implemented outside the flash memory, typically in a process technology optimized for logic circuits to achieve the lowest area. It is at the expense, however, of the additional aggressor cell data that must be transferred on the interface 850.

Figure 9:
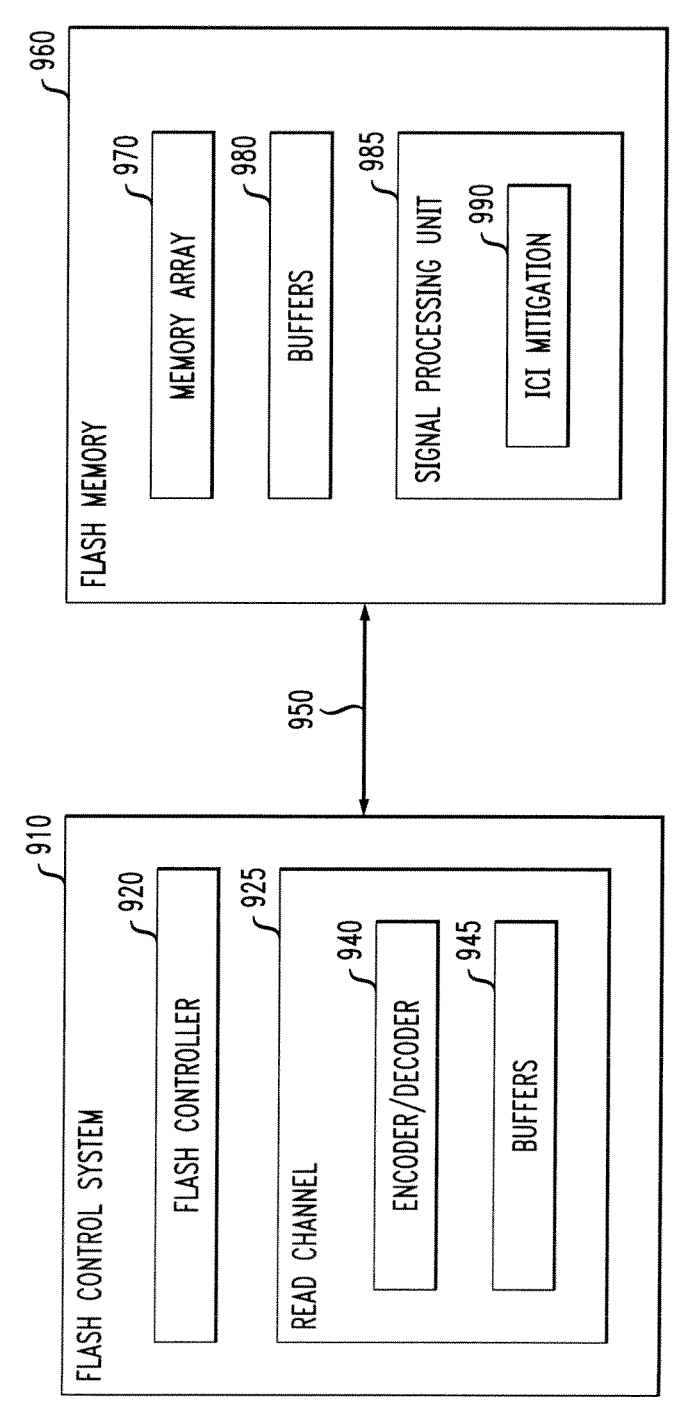
FIG. 9 is a schematic block diagram of an exemplary flash memory system incorporating memory-based ICI mitigation techniques in accordance with an alternate embodiment of the present invention.

FIG. 9 is a schematic block diagram of an exemplary flash memory system 900 incorporating memory-based ICI mitigation techniques in accordance with an alternate embodiment of the present invention. As shown in FIG. 9, the exemplary flash memory system 900 comprises a flash control system 910 and a flash memory block 960, connected by an interface 950. The exemplary flash control system 910 comprises a flash controller 920 and an optional read channel 925, typically on one or more integrated circuits. The exemplary read channel 925 comprises an encoder/decoder block 940 and one or more buffers 945. In an alternative embodiment, the encoder/decoder block 940 and some buffers 945 may be implemented inside the flash controller 920. The exemplary flash controller 920 may be implemented, for example, using well-known commercially available techniques and/or products, as modified herein to support the features and functions of the present invention. The encoder/decoder block 940 and buffers 945 may be implemented using well-known commercially available techniques and/or products.

The exemplary flash memory block 960 comprises a memory array 970 and one or more buffers 980 that may each be implemented using well-known commercially available techniques and/or products. In addition, the exemplary flash memory block 960 comprises an exemplary signal processing unit 985 that comprises one or more processors that implement one or more ICI mitigation processes 990, discussed further below in conjunction with, for example, FIGS. 10-12. In addition, the data flow among the various blocks shown in FIG. 9 is also discussed further below in conjunction with, for example, FIGS. 10-12. Generally, as discussed further below, to perform ICI mitigation during a read operation, the one or more ICI mitigation processes 990 compute the new read values based on the hard or soft read values read from the memory array 970. Likewise, as discussed further below in conjunction with FIG. 10, to perform ICI mitigation during a write operation, the one or more ICI mitigation processes 990 generate precompensated program values based on the program data received from the flash controller 910 for the target and aggressor cells.

In various embodiments of the disclosed ICI mitigation techniques, the exemplary interface 950 may need to convey additional information relative to a conventional flash memory system, such as values representing information associated with aggressor cells. Thus, the interface 950 may need to have a higher capacity (for example more input or output pins) or faster rate than an interface in conventional flash memory systems The interface 950 may optionally be implemented, for example, in accordance with the teachings of International PCT Patent Application Serial No. PCT/US09/49328, entitled "Methods and Apparatus for Interfacing Between a Flash Memory Controller and a Flash Memory Array," filed contemporaneously herewith and incorporated by reference herein, which increases the information-carrying capacity of the interface 950 using, for example, Double Data Rate (DDR) techniques.

During a write operation, the interface 950 transfers the program data to be stored in the target and aggressor cells, and the precompensated program values are computed inside the flash memory 960. The interface 950 would transfer for example the program data for the page with the target cell as in a conventional flash memory system, and in addition program data for adjacent wordlines or even or odd bit lines with the aggressor cells. Typically, less bits are required to represent this program data than to represent precompensated program values. Therefore, for write-side ICI mitigation, interface 950 would typically require less bandwidth than interface 850. This is however at the expense of implementing the write-side ICI mitigation processes inside the memory using the memory process technology used to manufacture the flash memory, which is typically optimized for memory and not logic circuits.

During a read operation, the interface 950 transfers the new hard or soft read values or data that was computed by the ICI mitigation processes 990 for the target cell(s) and optionally the aggressor cells. Typically, the information conveyed for a single read access is a page or wordline of data. It is noted that only sending data for the target cells reduces the bandwith requirements of the interface 950, at the expense of implementing the read-side ICI mitigation processes inside the memory using the memory process technology used to manufacture the flash memory, which is typically optimized for memory and not logic circuits.

It is noted that the capacitive coupling coefficients, $k_x$, $k_y$, and $k_{xy}$ for the x, y and xy directions, respectively, shown in FIG. 7, employed in the various embodiments of the ICI mitigation techniques of FIGS. 8 and 9 can be computed in the flash control system 810, 910 and/or the flash memory block 860, 960. It may be necessary for the capacitive coupling coefficients, $k_x$, $k_y$ and $k_{xy}$, to be transferred on the respective interface 850, 950. It is noted that the capacitive coupling coefficients may be adaptive and updated on a continuous, occasional or periodic basis.

As previously indicated, various aspects of the present invention provide signal processing techniques to mitigate ICI. Among other benefits, signal processing approaches to ICI mitigation are not bounded by technology and physical restrictions. Generally, as discussed hereinafter, write-side ICI mitigation can be achieved during programming of the target cells 710 with the knowledge of the program voltages that will be stored in the aggressor cells 720. Likewise, read-side ICI mitigation can be achieved with the knowledge of the voltages that are already stored in the aggressor cells 720. Thus, aspects of the present invention provide exemplary write-side and read-side ICI mitigation techniques. In a further variation of the present invention, ICI mitigation can be achieved using a combination of the disclosed write-side and read-side ICI mitigation techniques.

Write-Side ICI Mitigation

Figure 10:
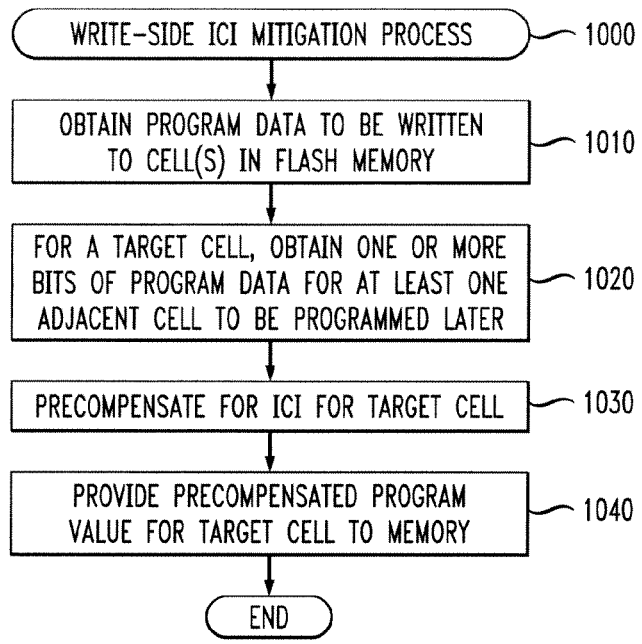
FIG. 10 is a flow chart describing an exemplary implementation of a write-side ICI mitigation process incorporating features of the present invention.

FIG. 10 is a flow chart describing an exemplary implementation of a write-side ICI mitigation process 1000 incorporating features of the present invention. As discussed above in conjunction with FIGS. 8 and 9, the write-side ICI mitigation process 1000 would typically be implemented by the signal processing unit 830 in the flash control system 810 or the signal processing unit 985 in the flash memory 960. As shown in FIG. 10, the write-side ICI mitigation process 1000 initially obtains program data to be written to one or more target cells 710 in the flash memory 700 during step 1010. As previously indicated, a more detailed discussion of exemplary page or wordline level access techniques can be found, for example, in International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

Thereafter, during step 1020, for a target cell 710, the write-side ICI mitigation process 1000 obtains one or more bits of program data for at least one adjacent cell 720 to be programmed later. It is noted that the aggressor cells 720 obtained during step 1020 may be associated with adjacent pages in a memory 700 and the write-side ICI mitigation process 1000 may have to wait until the program data for the aggressor cells 720 become available. The program data for the target cell and potential aggressor cells may be stored for example in the buffers 845 or 980 until all values for the aggressor cells become available. These buffers may store for example the page with the target cell, and adjacent pages in x, y or xy direction in adjacent wordlines or adjacent even or odd bitlines until a sufficient amount of data has been collected to perform ICI mitigation. Program data for potential aggressor cells may be available in the buffers from a prior write process. As previously indicated, the aggressor cells 720 are identified by analyzing the programming sequence scheme (such as bottom up or even/odd techniques) to identify the aggressor cells 720 that are programmed after a given target cell 710.

The write-side ICI mitigation process 1000 precompensates for ICI for the target cell during step 1030. The new program voltage of the target cell 710 that compensates for the expected ICI is obtained with following equation:

$$PV_{tc}^{(i,j)} = PV_t^{(i,j)} - \Delta V_c \qquad (2)$$

where $PV_t$ is the original program threshold voltage for a wordline i and a bitline j; $PV_{tc}$ is the new program threshold voltage after ICI cancelation and $\Delta V_c$ is the ICI cancelation term.

Generally, the ICI mitigation term for equation (2) is computed based on the coupling coefficients and the voltage changes of the aggressor cells 720. As previously to indicated, in the exemplary embodiment of FIG. 7, the aggressor cells 720 comprise the cells in the same wordline and the upper adjacent wordline. Optionally, also aggressor cells in the lower adjacent wordline can be considered if they cause ICI. Thus, both the shift and widening of the voltage distributions due to ICI are mitigated.

The ICI mitigation term can be computed as follows:

$$\Delta V_c^{(i,j)} = k_x \Delta V_t^{(i,j-1)}(l) + k_x \Delta V_t^{(i,j+1)}(l) + k_y \Delta V_t^{(i+1,j)}(l) + k_{xy} \Delta V_t^{(i+1,j-1)}(l) + k_{xy} \Delta V_t^{(i+1,j+1)}(l) \qquad (3)$$

where $\Delta V_t^{(w,b)}(l)$ is the change in $V_t$ voltage of aggressor cell (w,b) when voltage level l is programmed into cell (w, b), where w indicates a wordline i and b indicates a bitline j; l ∈ {1, 2, ... L} is the voltage level (L=8 for 3 bits/cell); and $k_x$, $k_y$ and $k_{xy}$ are the capacitive coupling coefficients for the x, y and xy directions shown in FIG. 7. Note that different voltage levels l can be programmed into the different target and aggressor cells.

For $\Delta V_t^{(w,b)}(l)$, the expected or average change in the $V_t$ voltage can be used for example.

Finally, the precompensated program values computed for the target cell 710 during step 1030 are provided to the flash memory 860, 960 during step 1040.

Read-Side ICI Mitigation

As previously indicated, read-side ICI mitigation can be achieved with the knowledge of the voltages that are stored in the aggressor cells 720. As discussed herein, the disclosed read-side ICI mitigation techniques can process soft voltage values retrieved from flash cells, or hard voltage levels (detected voltages levels) (or a combination thereof). In one exemplary embodiment, a soil voltage value is used for the target cell 710, while hard voltage levels are used for the aggressor cells 720.

Figure 11:
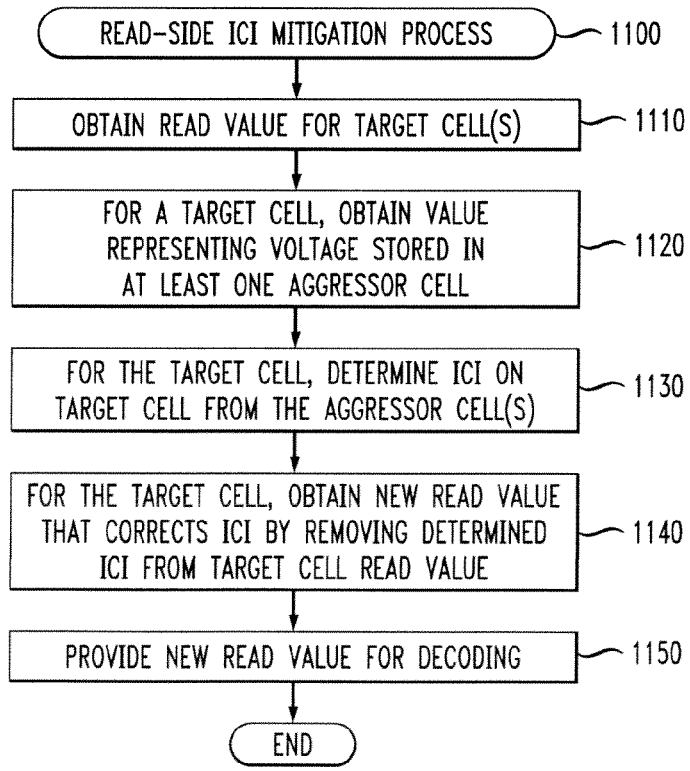
FIG. 11 is a flow chart describing an exemplary implementation of a read-side ICI mitigation process incorporating features of the present invention.

FIG. 11 is a flow chart describing an exemplary implementation of a read-side ICI mitigation process 1100 incorporating features of the present invention. As discussed above in conjunction with FIGS. 8 and 9, the read-side ICI mitigation process 1100 would typically be implemented by the signal processing unit 830 in the flash control system 810 or the signal processing unit 985 in the flash memory 960. The read-side ICI mitigation process 1100 is typically implemented upon receiving a request to read a given page or wordline. Thereafter, the flash controller 820 typically identifies the cells that need to be read.

As shown in FIG. 11, the read-side ICI mitigation process 1100 initially obtains the read value for one or more target cell(s) 710 during step 1110. Thereafter, for a given target cell 710, the read-side ICI mitigation process 1100 obtains a value during step 1120 representing the voltage stored in at least one aggressor cell 720. The value for the target and aggressor cells can be a hard or soft value. The hard value can be a detected voltage level obtained by comparing the read threshold voltage with voltage level thresholds as described above, or by signal processing or decoding techniques. It is noted that the value obtained during step 1120 can be a measured value or an expected value. based on, for example, on the mean of the voltage distribution associated with a given level or state.

If an expected value is used, knowledge of the actual values stored in the adjacent wordline is not required to achieve cancellation. For example, single wordline containing the target cell can be measured, and an expected value can be used for the voltage stored in the adjacent wordline (aggressor cells 720). Thus, measured values would be used for aggressor cells in the same wordline, and expected values for aggressor cells in an adjacent wordline. The expected values can be computed for example off-line with knowledge of the voltage distributions. Using expected values for an adjacent wordline has the advantage that this adjacent wordline does not need to be read, and that data corresponding to this adjacent wordline does not need to be transmitted over the interface bus 850.

In a further variation. soft values can be employed for the target cell 710, while hard values are used for the aggressor cells 720, to reduce the data sent on the interfaces 850. 950.

It is noted that the values for the aggressor cells 720 obtained during step 1120 may be associated with adjacent pages in a memory 700 and the read-side ICI mitigation process 1100 may have to wait until the values for the aggressor cells 720 become available. The values for the target cell and potential aggressor cells may be stored for example in the buffers 845 or 980 until all values for the aggressor cells become available. These buffers may store for example the page with the target cell, and adjacent pages in x, y or xy direction in adjacent wordlines or adjacent even or odd bit-lines until a sufficient amount of data has been collected to perform ICI mitigation. Values for potential aggressor cells may also be available in the buffers from a prior read process.

During step 1130, the read-side ICI mitigation process 1100 determines the ICI for the target cell 710 from the corresponding aggressor cell(s) 720. The ICI for the target cell 710 is obtained with following equation:

$$DV_c^{(i,j)} = k_x DV_t^{(i,j-1)}(l) + k_x DV_t^{(i,j+1)}(l) + k_y DV_t^{(i+1,j)}(l) + k_{xy} DV_t^{(i+1,j-1)}(l) + k_{xy} DV_t^{(i+1,j+1)}(l) \qquad (4)$$

where $DV_c^{(w,b)}(l)$ is the average, actual or estimated change in $V_t$ voltage of cell (w, b), when voltage level l is programmed into cell (w, b), where w indicates a wordline i and b indicates a bitline j. l ɫ ∈ {1, 2, ... L} is the voltage level (L=8 for 3 bits/cell). $k_x$, $k_y$ and $k_{xy}$ are capacitive coupling coefficients for the x, y and xy directions shown in FIG. 7. The change in $V_t$ voltage can be, for example, the difference between a measured value and a baseline or reference voltage.

For example, if the measured value indicates that the flash memory cell is in the final state '10' in FIG. 5B, the change in voltage can be computed as difference between this measured value and a reference voltage for state 'x0', where for example the mean for the distribution of state 'x0' is used as reference voltage.

Generally, the ICI mitigation term for equation (4) is computed based on the coupling coefficients and the voltage changes of the aggressor cells 720. As previously indicated, in the exemplary embodiment of FIG. 7, the aggressor cells 720 comprise the cells in the same wordline and the upper adjacent wordline. Optionally, also the cells in the lower adjacent wordline can be considered as aggressor cells if they cause ICI. Thus, both the shift and widening of the voltage distributions are mitigated. In an embodiment where data is only considered from the same wordline, the shift of the voltage distributions is mitigated, and the widening is reduced by a smaller amount.

The read-side ICI mitigation process 1100 obtains the new read value during step 1140 that corrects the ICI for the target cell 710, by removing the determined ICI from the read value of the target cell 710 as follows:

$$RV_{tc}^{(i,j)} = RV_{t}^{(i,j)} - \Delta V_c \quad (5)$$

where $RV_t$ is the original read voltage or read value for a wordline i and bitline j; $RV_{tc}$ is the new read voltage or new read value for the wordline i and bitline j after ICI cancelation and $\Delta V_c$ is the ICI cancelation term.

Finally, the read-side ICI mitigation process 1100 provides the new read value for decoding during step 1150.

Figure 12:
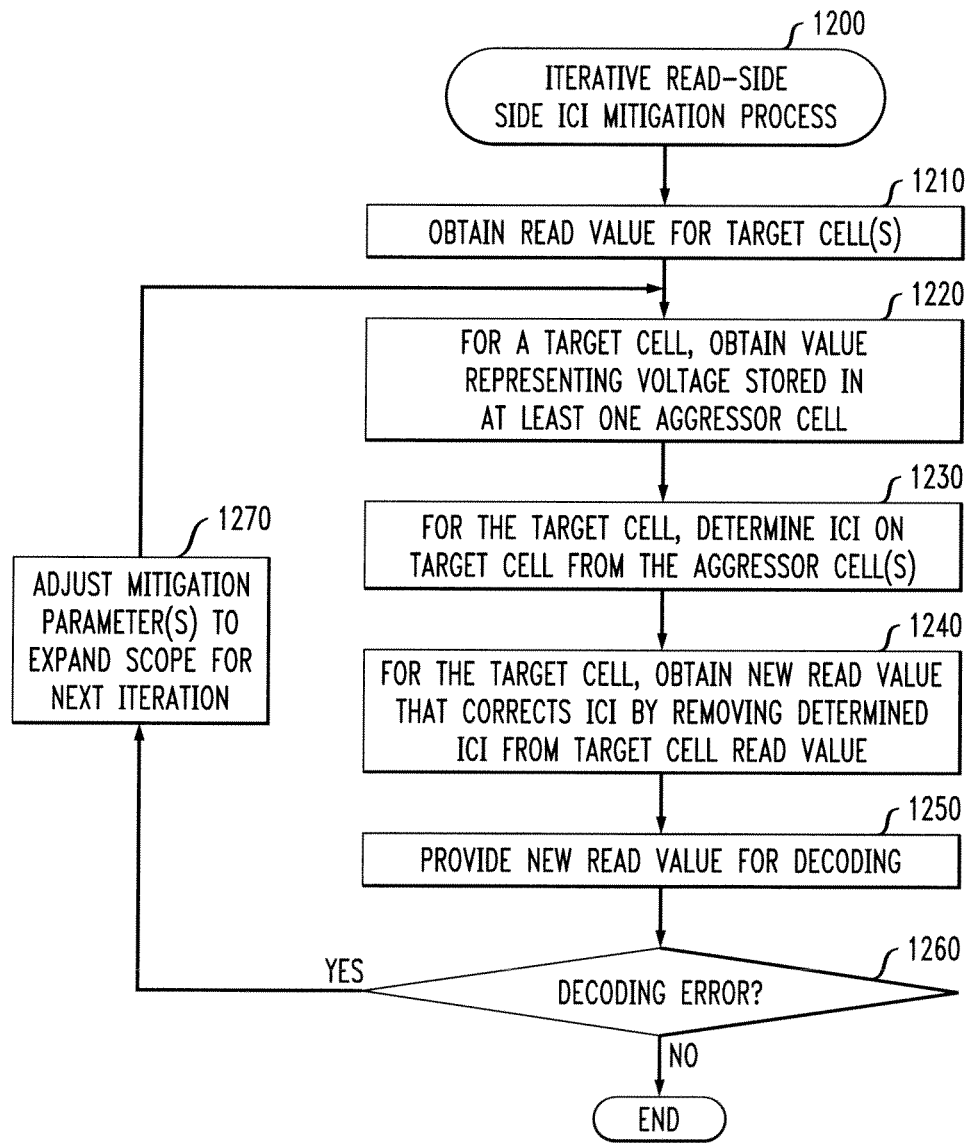
FIG. 12 is a flow chart describing an exemplary implementation of an iterative read-side ICI mitigation process incorporating features of the present invention.

FIG. 12 is a flow chart describing an exemplary implementation of an iterative read-side ICI mitigation process 1200 incorporating features of the present invention. As discussed above in conjunction with FIGS. 8 and 9, the iterative read-side ICI mitigation process 1200 would typically be implemented by the signal processing unit 830 in the flash control system 810 or the signal processing unit 985 in the flash memory 960. Generally, steps 1210 through 1250 of the iterative read-side ICI mitigation process 1200 are substantially similar to the corresponding steps 1110 through 1150 of the read-side ICI mitigation process 1100 of FIG. 11.

A test is performed during step 1260 to determine if a decoding error is detected (for example, by the decoder 840 (FIG. 8)). If it is determined during step 1260 that a decoding error has not occurred, then program control terminates.

It however. it is determined during step 1260 that a decoding error has occurred, then one or more ICI mitigation parameter(s) are adjusted during step 1270 to expand the scope of the ICI mitigation for a subsequent iteration of the process 1200. For example, the first pass or iteration of the process 1200 may compensate only for ICI in the same page or wordline containing the target cell (for page or wordline access techniques, respectively). If a decoding error is detected during step 1260, the second pass or iteration to of the process 1200 can also encompass one or more adjacent pages or wordlines to consider ICI from the x, y and, optionally, the xy directions.

In a further variation, the first pass or iteration of the process 1200 may employ only hard values for the target and/or aggressor cells, but be expanded in the event of a decoding error to include soft values for the target and/or aggressor cells. Soft is information may be obtained by reading out voltages with an increased number of voltage level thresholds, or by rereading voltages with different thresholds compared to the first reading (soft information can then be computed based on these multiple read values)

In both the read-side ICI mitigation process 1100 and iterative read-side ICI mitigation process 1200, the voltages employed for ICI mitigation can be either a soft voltage value with more precision than the number of bits stored per cell, or a value quantized to a hard voltage level with the same resolution as the number of bits stored per cell (for example, three bits for an MLC memory with three bits/cell). In another variation of the read processes, a soft voltage value can be used for the target cell 710 and a hard voltage level can be used for the aggressor cells 720. In addition, ICI mitigation can be based on detected values for the aggressor cells 720, where the detected values are obtained by reading aggressor cells and detecting the stored values with signal processing and decoding techniques. Alternatively, the detected values could be read from a buffer 845, 880, 945 or 980. where they have been stored atler a prior read process.

ICI Mitigation Simplifications

A. Multi-Step Page Programming Sequence

As discussed above, FIGS. 5A and 5B illustrate an exemplary multi-step page programming sequence. An aspect of the present invention recognizes that when a multi-step page programming sequence is applied to an MIX flash device 600, the ICI that appears during the intermediate programming is offset by subsequent programming of the final upper page. Generally, the final programming of the upper (MSB) page reprograms and tightens the distribution of the final programmed voltages and therefore cancels ICI, which was applied to the intermediate state. Thus, in one embodiment of the invention, ICI is only canceled when the final upper most page (MSB) is programmed. It is optional to cancel ICI for the programming of lower pages (i.e., intermediate states), but in general not required to achieve good error rate performance. For example, for the three bits/cell flash device 600 of FIG. 6, the intermediate programming of the lower and middle pages can be ignored.

Generally, for write-side ICI mitigation, knowledge of the program levels l of aggressor cells, for example in adjacent wordlines or bitlines is required. In general, there are L different $\Delta V_r(l)$ values in equation (3). In the exemplary MLC flash cell array 600 of FIG. 6, for example. L is equal to 8 in the MLC flash cell array 600 having three bits per cell. One aspect of the present invention, however, recognizes that depending on the employed programming algorithm, only M different $\Delta V_r(l)$ can be used to approximately describe the L different $\Delta V_r(l)$ values, where M<L. For the exemplary programming scheme shown in FIG. 5B, it is sufficient to consider M=3 different $\Delta V_r(l)$ since the transitions from '11' to '01' and 'x0' to '10' have approximately the same voltage shift. The more complex ICI mitigation process would consider L=4 different $\Delta V_r(l)$ values for all possible transitions '11' to '11', '11' to '01', 'x0' to '00', 'x0' to '10', In the embodiment of FIG. 7, the number of distinct Aril, values in equations (2) and (3) is then $M^5$ instead of $L^5$. as there are five adjacent cells 720 that cause ICI. The number of distinct $\Delta V_c$ values that need to be computed is therefore significantly reduced when M<L.

When a multi-step page programming sequence is employed for the exemplary flash memory shown in FIG. 7, the controller-based or memory-based ICI mitigation processes 1000, 1100 of FIGS. 10 and 11, respectively, are implemented as follows. The page data is temporarily stored in the buffer memory 845 or 980 and not written to the flash memory device 870, 970 until the upper page data for the upper adjacent wordline is available. The respective ICI mitigation block 835 or 990 computes the new program voltages (pre-compensated program values) based on these data hits, as discussed above in conjunction with FIG. 10. If the power supply voltage drops below a threshold voltage, for example, due to a power interruption or shutdown, the data stored in the buffer memory 845 or 980 can be written to the flash memory 870, 970 (or another non-volatile memory) to prevent loss of data.

Also for read-side ICI mitigation, the number of distinct $\Delta V_c$ that are computed based on equations (4) and (5) can be reduced by taking into account voltage shift properties of the multi-step programming sequence and considering only M<L distinct voltage shifts $\Delta V_r(l)$ In the embodiment of FIG. 7, the number of distinct $\Delta V_c$ values in equations (4) and (5) is then $M^5$ instead of $L^5$, as there are five adjacent cells 720 that cause ICI.

The above-described write-side and read-side ICI mitigation can be applied not only to the final state, but also intermediate states, for example when a middle page in a 3-bits/ cell flash is programmed, or when reading an intermediate state that was formed after programming a middle page in a 3-bits/cell flash.

It is noted that multi-step page programming considerations affect both the reading and writing of a flash memory. Once programmed to an intermediate state, a cell can be maintained in the intermediate state indefinitely. When a cell is an intermediate state during a read operation, ICI mitigation can be implemented in accordance with the present invention.

B. Neglect Capacitive Coupling Coefficients in X-Y Direction

As previously indicated, in the exemplary embodiment, equations (3) and (4) consider capacitive coupling coefficients, $k_x$, $k_y$ and $k_{xy}$, to address ICI between a target cell 710 and up to five adjacent aggressor cells 720 in the exemplary flash memory shown in FIG. 7. Another aspect of the invention recognizes, however, that $k_{xy} \ll k_x < k_y$. Thus, capacitive coupling in the x-y direction, $k_{xy}$, can be neglected in equations (3) and (4), and the ICI mitigation term for a wordline i and a bitline j becomes:

$$\Delta V_c^{(i,j)} = k_x \Delta V_t^{(i,j-1)}(l) + k_x \Delta V_t^{(i,j+1)}(l) + k_y \Delta V_t^{(i+1,j)}(l) \quad (6)$$

The number of distinct $\Delta V_c$ values is then reduced to $L^3$ instead of $L^5$ as given by equations (3) and (4). The number of distinct $\Delta V_c$ values can be further reduced by considering only At M<L distinct voltage shifts $\Delta V_t(l)$. The number of distinct $\Delta V_c$ values that need to be computed is then reduced to $M^3$. In general, in ICI mitigation simplifications A and B the number of distinct $\Delta V_c$ values is given by $M^k$ where k is the number of considered aggressor cells and M is the number of distinct voltage shifts that are considered. Both equations (3) and (4) write- and read-side mitigation can be simplified as described here. By reducing the number of distinct $\Delta V_c$ values, also the number of precompensated program values is reduced as is apparent from equation (2). This helps for example to reduce the amount of data that needs to be transmitted over the interface 850 and as results, the capacity of the interface 850 (in terms of pins or transmission rate) can be reduced compared to a write-side mitigation scheme that does not reduce the number of distinct $\Delta V_c$ values by considering only M<L distinct voltage shifts $\Delta V_t(l)$.

C. Neglect Coefficient in X Direction for Even/Odd Programming

As discussed above in conjunction with FIG. 3, an exemplary even/odd programming sequence selects either an even or odd bitline cell and programs sequentially (bottom up) in the indicated order. Another aspect of the present invention recognizes that coupling in the x direction can be neglected for either oven or odd pages (for example. for odd pages if odd pages are programmed after even pages). Therefore, for odd pages, the ICI mitigation term in equation (3) for a wordline i and a bitline j simplifies to:

$$\Delta V_c^{(i,j)} = k_y \Delta V_t^{(i+1,j)}(l). \quad (7)$$

where the number of distinct $\Delta V_c$ values that need to be computed is reduced to only M. Some flash architectures with parallel programming of odd and even bit lines allow for x coupling to be omitted all together with little performance loss. In general, Equation (7) can be used for both even and odd pages to reduce hardware complexity. Both equations (3) and (4) for write- and read-side mitigation can be simplified as described here.

D. Address Residual ICI and Retention Effects by Adjusting Voltage Level Thresholds One aspect of the present invention recognizes that a constant and/or residual ICI effect and voltage shifts due to retention and leakage effects can be addressed by an appropriate adjustment of one or more voltage level thresholds.

It is noted that the disclosed ICI mitigation techniques can be achieved despite degradation of the signal due to retention. The threshold voltages of the target and aggressor cells will shift each by a respective amount due to retention and the associated leakage effects. By choosing appropriate voltage level thresholds, the retention effect and residual ICI effects can be mitigated.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the worldwide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A system for reading a flash memory device, comprising:
a memory; and
at least one processor, coupled to the memory, operative to:
obtain a read value for at least one target cell:
obtain a value representing a voltage stored in at least one aggressor cell that was programmed after said target cell;
determine intercell interference for said target cell from said at least one aggressor cell; and
obtain a new read value that compensates for said intercell interference by removing said determined intercell interference from said read value for said at least one target cell.

2. A method for reading a flash memory device, comprising:
obtaining a read value for at least one target cell;
obtaining a value representing a voltage stored in at least one aggressor cell that was programmed after said target cell;
determining intercell interference for said target cell from said at least one aggressor cell; and
obtaining a new read value that compensates for said intercell interference by removing said determined intercell interference from said read value for said at least one target cell.

3. The method of claim 2, wherein said determining step determines said intercell interference for said target cell as follows:

$$DV_c^{(i,j)} = k_x DV_t^{(i,j-1)}(l) + k_x DV_t^{(i,j+1)}(l) + k_y DV_t^{(i+1,j)}(l) + k_{xy} DV_t^{(i+1,j-1)}(l) + k_{xy} DV_t^{(i+1,j+1)}(l) \quad (4)$$

where $DV_c^{(w,b)}(l)$ is the average, actual or estimated change in $V_t$ voltage of cell (w,b), when voltage level l is programmed into cell (w, b), where w indicates a wordline i and b indicates a bitline j, $l \in \{1,2,...,L\}$ is the voltage level (L=8 for 3 bits/cell), $k_x$, $k_y$ and $k_{xy}$ are capacitive coupling coefficients for the x, y and xy directions.

4. The method of claim 2, wherein said step of obtaining a new read value further comprises the step of removing said determined intercell interference from said read value of said at least one target cell as follows:

$$RV_{tc}^{(i,j)} = RV_t^{(i,j)} - \Delta V_c \quad (5)$$

where $RV_t$ is the original read voltage or read value for a wordline i and a bitline j; $RV_{tc}$ is the new read voltage or new read value for the wordline i and bitline j after ICI cancelation and $\Delta V_c$ is the ICI cancelation term.

5. The method of claim 2, further comprising the step of receiving a request to read a given page or wordline.

6. The method of claim 2, further comprising the step of identifying the cells that need to be read.

7. The method of claim 2, wherein said value representing a voltage stored in at least one aggressor cell comprises one or more of a measured value, an expected value, an estimated value, an average value, a quantized value and a detected value.

8. The method of claim 7, wherein said measured value comprises one or more of hard voltage values and soft voltage values.

9. The method of claim 7, wherein said expected value comprises a mean of a voltage distribution associated with as given state.

10. The method of claim 2, further comprising the step of adjusting one or more intercell interference mitigation parameters if a decoding error occurs.

11. The method of claim 10, wherein said intercell interference mitigation parameters comprise a number of considered aggressor cells.

12. The method of claim 10, wherein said intercell interference mitigation parameters comprise a use of soft voltage values in addition to hard voltage values.

13. The method of claim 2, wherein said at least one aggressor cell comprises one or more cells adjacent to said target cell.

14. The method of claim 13, wherein said at least one aggressor cell comprises one or more adjacent cells in a same wordline as said target cell.

15. The method of claim 13, wherein said at least one aggressor cell comprises one or more cells in an upper or lower adjacent wordline to said target cell.

16. The method of claim 13, wherein at least one of said at least one aggressor cells is stored in a buffer until all of said at least one aggressor cells are available.

17. The method of claim 13, wherein said at least one aggressor cell is identified by analyzing a programming sequence scheme employed for said flash memory device.

18. The method of claim 2, where said determining step computes intercell interference based on said value representing a voltage stored in at least one aggressor cell.

19. The method of claim 8, where said determining step computes intercell interference based on said measured value and a reference value.

20. The method of claim 2, wherein said value representing a voltage stored in at least one aggressor cell comprises a measured value if said aggressor cell is in the same page or wordline as the target cell, and said value representing a. voltage stored in at least one aggressor cell comprises an estimated value if said aggressor value is in a different page or wordline as the target cell.

21. The method of claim 2, wherein said obtained read value for said at least one target cell and said obtained value representing a voltage stored in said at least one aggressor cell are obtained by means of an interface from a memory array in said flash memory device.

22. The method of claim 2, wherein said new read value is provided to said decoder by means of an interface.

23. The method of claim 2, wherein said method is applied to one or more steps of a multi-step page programming sequence.

24. The method of claim 2, wherein said step of determining intercell interference neglects said intercell interference for said target cell from diagonally adjacent aggressor cells.

25. The method of claim 2, wherein said step of determining intercell interference neglects said intercell interference for said target cell from one or more adjacent cells in the same wordline for an even/odd programming sequence.

26. The method of claim 2, further comprising the step of providing said new read value to a decoder.

27. The method of claim 2, wherein voltage shift properties of as multi-step programming sequence are employed to reduce as number of distinct voltage shifts $\Delta V_c$ values to be computed to $M^k$, wherein $M<L$, k is a number of considered aggressor cells, L is a number of levels provided by said flash memory device and M is the number of distinct voltage shifts that are considered.

* * * * *

UNITED STATES PATENT AND TRADEMARK OFFICE
CERTIFICATE OF CORRECTION

PATENT NO. : 8,462,549 B2
APPLICATION NO. : 13/001278
DATED : June 11, 2013
INVENTOR(S) : Haratsch et al.

It is certified that error appears in the above-identified patent and that said Letters Patent is hereby corrected as shown below:

In the Specification

Column 1, line 9 has a unnecessary paragraph break that should be removed; Column 11, line 8, which reads: "a bitline j;PV" should read --a bitline j; PV-- including the space between ";" and "PV"; Column 12, line 20, which reads: "on the interfaces 850. 950" should read --on the interfaces 850, 950--; Column 13, line 31, which reads: "It however. it is" should read --If, however, it is--.

In the Claims

Column 18, claim 20, line 43, which reads: "representing a. voltage" should read --representing a voltage--.

Signed and Sealed this
Twenty-second Day of October, 2013

Teresa Stanek Rea
*Deputy Director of the United States Patent and Trademark Office*